United States Patent [19]
Hilley et al.

[11] Patent Number: 5,555,249
[45] Date of Patent: Sep. 10, 1996

[54] NON-DESTRUCTIVE MEMORY TESTING IN COMPUTERS

[75] Inventors: Michael R. Hilley, Belton; William J. Kass, Easley, both of S.C.

[73] Assignee: NCR Corporation, Dayton, Ohio

[21] Appl. No.: 761,578

[22] Filed: Sep. 18, 1991

[51] Int. Cl.⁶ .................................................. G01P 29/00
[52] U.S. Cl. ..................... 371/21.1; 371/21.2; 371/27; 371/25.1; 395/180; 395/183.18
[58] Field of Search .................... 371/21.1, 21.2, 371/23, 27, 25, 25.1; 395/575, 425, 180, 183.18

[56] References Cited

U.S. PATENT DOCUMENTS

| | | | |
|---|---|---|---|
| 4,430,727 | 2/1984 | Moore et al. | 371/10 X |
| 4,468,759 | 8/1984 | Kung et al. | 365/201 OR |
| 4,672,583 | 6/1987 | Nakaizumi | 365/201 OR |
| 4,733,394 | 3/1988 | Giebel | 365/201 OR |
| 4,744,061 | 5/1988 | Takemae et al. | 365/201 OR |
| 4,811,299 | 3/1989 | Miyazawa et al. | 365/201 OR |
| 4,868,823 | 9/1989 | White, Jr. et al. | 371/21.3 OR |
| 4,891,811 | 1/1990 | Ash et al. | 371/21.2 OR |
| 4,980,888 | 12/1990 | Bruce et al. | 371/21.1 OR |

*Primary Examiner*—James P. Trammell
*Assistant Examiner*—Kamini Shah
*Attorney, Agent, or Firm*—Gregory A. Welte; Paul J. Maginot

[57] ABSTRACT

In computers, a test of memory is generally performed at the time of powering up. In one form of the invention, this type of test is run on part of Random Access Memory (RAM), while allowing data or a program to reside in another part. Then, after the partial test is completed, the data is transferred into the RAM just tested, and the RAM which previously held the data is tested. Thus, the data can co-exist in memory while the test runs, by being shuttled from one location to another.

4 Claims, 6 Drawing Sheets

NON-DESTRUCTIVE MEMORY TESTING IN COMPUTERS

The invention concerns testing of memory in computers, especially the testing performed during start-up routines.

BACKGROUND OF THE INVENTION

Personal computers and micro-computers are presently being manufactured with large amounts of random-access memory. When the user starts up one of these computers, the computer automatically tests its memory for operability. The testing is performed by the processor (or a designated processor in a multi-processor machine), which runs a testing program. The testing program does the following: (1) it writes data to each memory location, (2) it reads the data, and (3) checks the data read for errors.

With ever-increasing amounts of memory, the time required to perform this testing becomes inconvenient: the testing delays the availability of the memory for other uses. That is, during the test, the memory cannot be used to store data or programs, because the testing itself would wipe out the stored data.

OBJECTS OF THE INVENTION

It is an object of the invention to provide an improved memory testing system for a computer.

It is a further object of the invention to provide a memory testing system which allows data to be stored in memory while testing proceeds.

SUMMARY OF THE INVENTION

In one form of the invention, a test is run on part of Random Access Memory (RAM), while allowing data or a program to reside in another part. Then, the data is relocated into the RAM just tested, and the former residence of the data is tested. Thus, the data can co-exist in memory with the occurrence of the testing procedure. dr

DETAILED DESCRIPTION OF THE INVENTION

A simplified explanation will be given, followed by a more detailed description.

Figure 1:
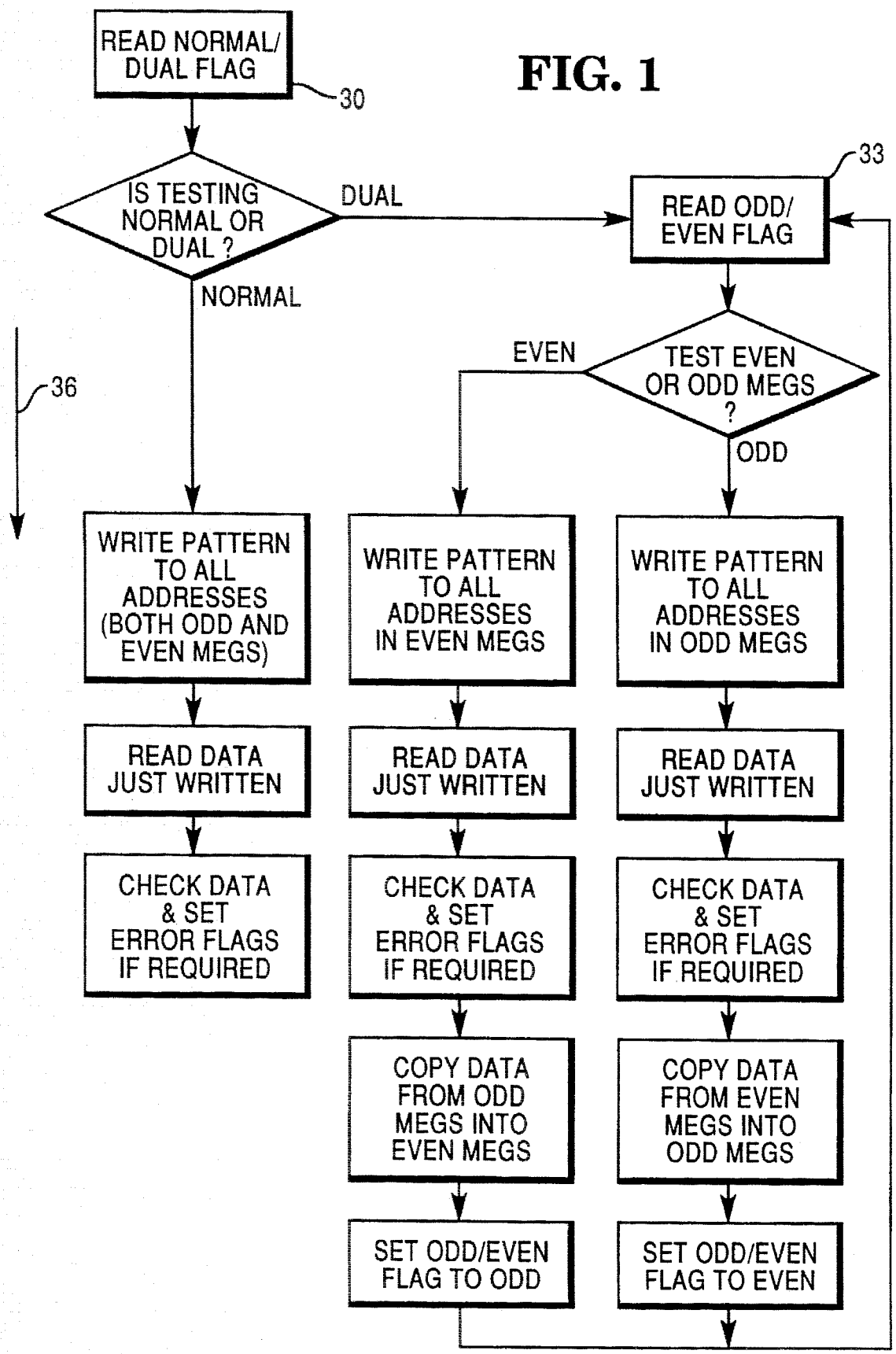
FIG. 1 is a flow chart illustrating one form of the invention.

Simplified Explanation—FIG. 1

FIG. 1 is a flow chart illustrating one implementation of the invention. Two registers (not shown in FIG. 1) are dedicated to the invention, namely, a NORMAL/DUAL register and an ODD/EVEN register. Prior to testing, a processor (or other appropriate agent) stores a bit in the NORMAL/DUAL register. The bit dictates whether the testing should be NORMAL (wherein the invention is not used) or DUAL (wherein the invention is used).

As block 30 indicates, the invention reads this bit, and takes action accordingly. If the bit dictates NORMAL testing, the actions taken are those so indicated: a normal test of a known prior art type is undertaken, as indicated by decision path 36. On the other hand, if the bit dictates DUAL testing, the test of the invention is used, and the ODD/EVEN register is then read, in block 33.

This register dictates which Megabytes (ODD or EVEN) should be tested at the present time. If ODD Megs are to be tested, then data is allowed to be stored in EVEN memory locations. After testing of the ODD Megs, the data is switched: it is copied into the ODD Megs just tested, and then the EVEN Megs are tested.

That is, the invention tests ODD Megabytes (ie, Megs 1, 3, 5, etc.) while leaving the EVEN Megs (ie, Megs 2, 4, 6, etc.) alone. During this time, program data (or other types of data) is allowed to reside untouched in the EVEN, non-tested, Megs. Next, after this partial test has finished, the data is copied into the ODD Megs, and the EVEN Megs are tested, while leaving the ODD Megs alone. In this manner, program data (or other types of data) can co-exist with the running test: the program data is shuttled between non-tested Mega-byte sections of memory.

Implementation of FIG. 1

Numerous approaches, known in the art, can implement the procedures indicated in FIG. 1. For example, the testing program of FIG. 1 can reside in ROM. In this case, the testing can be performed by the main processor, or by another processor, namely, one contained within block 3 (described later) in FIG. 2.

Alternately, the testing program can be contained within the data which is shuttled between the ODD and EVEN Megs. As above, one of two processors can run this testing program: the main processor, or a processor contained within block 3 in FIG. 2.

Advantage of Shuttling Testing Program

Locating the testing program within the shuttled data allows the testing program to be very large, yet a correspondingly large dedicated memory is not required. That is, storing the testing program in ROM (as is frequently done in the prior art) requires a dedicated ROM; the longer the program, the larger the ROM needed. With the invention, however, the ROM can be eliminated, and its function (holding the testing program) is replaced by system RAM. Now, the system RAM performs the extra function of holding the testing program, and the ROM is eliminated.

This discussion will explain one type of testing system which can use the invention.

Greater Detail

Figure 2:
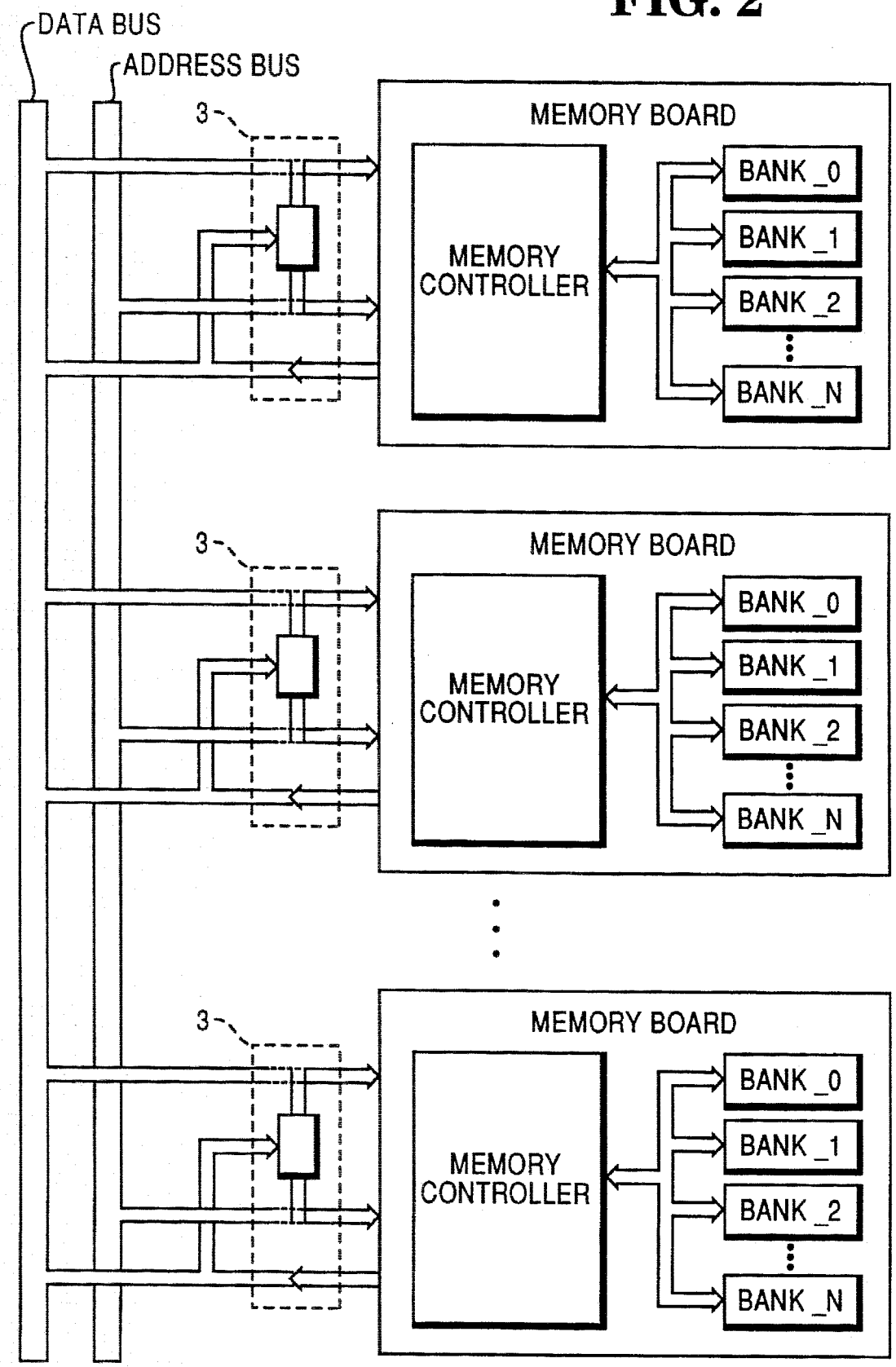
FIG. 2 illustrates three memory boards in a computer.

FIG. 2 illustrates several memory boards in a computer, each connected to both a data bus and an address bus. A "memory board" is a printed circuit board which contains one or more banks of memory, together with a memory controller. Boards, banks, and controllers are known in the art.

Figure 3A:
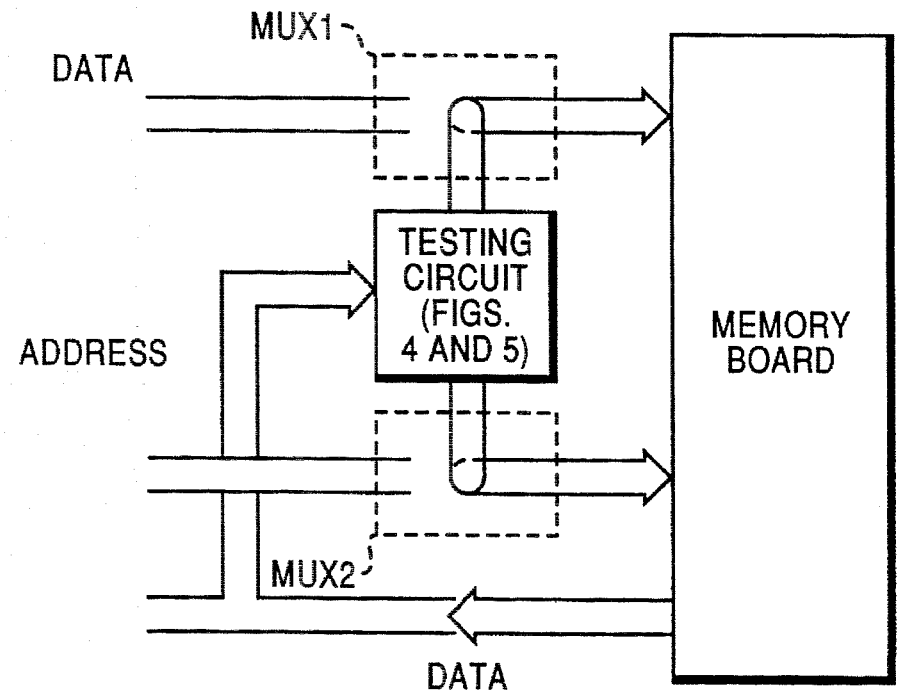
FIGS. 3a and 3b are enlargements of dashed blocks 3 in FIG. 2.
Figure 3B:
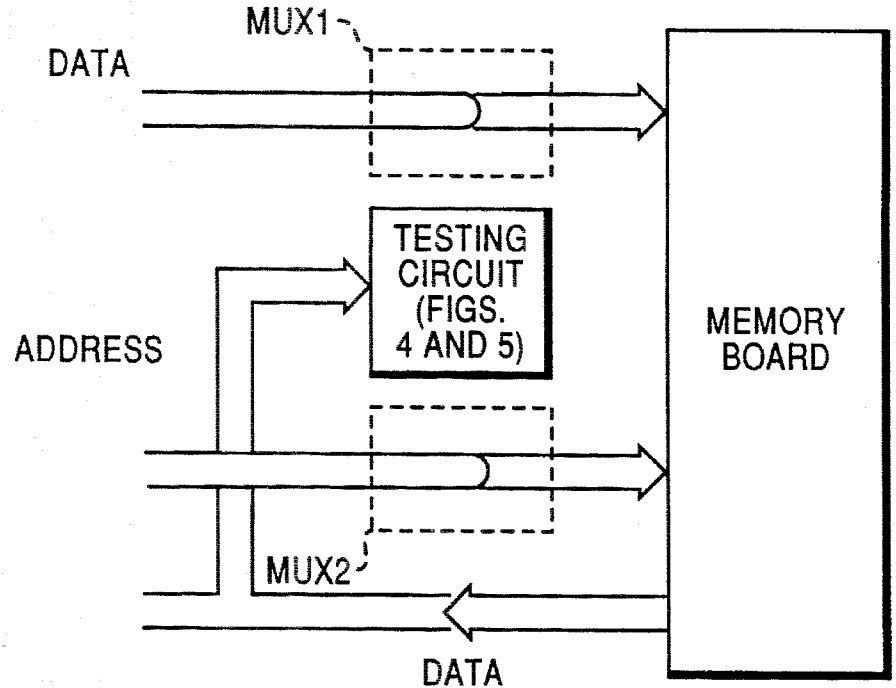

A testing device resides in the dashed blocks 3. FIG. 3 shows an enlarged view of one block 3. (The actual block 3 is not shown in FIG. 3.) Each block contains a testing circuit which can be interconnected into the data- and address busses by multiplexers MUX1 and MUX2. That is, when the invention is in operation, the multiplexers make the connections shown in Figure A. When the invention is not in operation, the connections are those of FIG. 3B. Thus, when the invention is not in operation, the invention is, effectively, invisible to the overall computer system, as FIG. 3B indicates.

Figure 4:
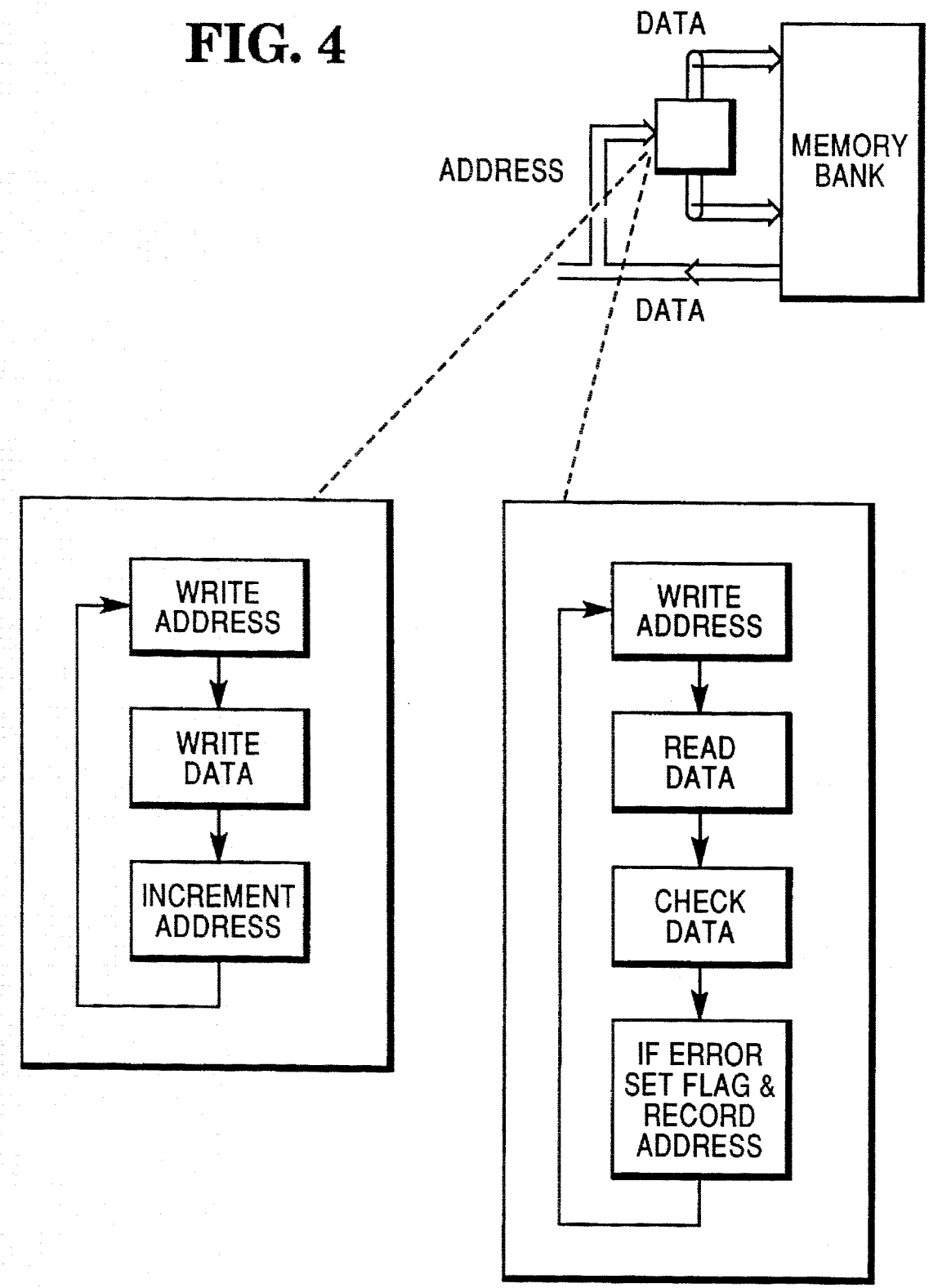
FIG. 4 illustrates the operation of the components of dashed blocks 3.

As indicated in FIG. 4, the following two sequence of events are undertaken:

First Sequence (Block 9, FIG. 4)

1. Write, onto bus 6, the lowest address on the memory board.
2. Writes, onto bus 9, a known data word. The data word is thus written to the address of step 1.
3. Increment the address and repeats the sequence, beginning with step 1.

After the data word has been written to all memory locations in the bank, the Second Sequence is executed:

Second Sequence (Block 14, FIG. 4)

4. Write, onto bus 6, the lowest address on the memory board.
5. Read the data at the address just written written in step 4. The data is read on bus 12.
6. Check the data just read against the original which was written in the First Sequence. If there is a discrepancy, then set an error flag and record the address from which the data was read.
7. Increment the address, and repeat the sequence, beginning with step 4.

After all of the addresses on the board have been read and checked, a signal issues on the TEST IN PROGRESS line in FIG. 5 (later discussed). This signal indicates to the processor that the test is complete, and allows the processor to gain access, if desired, to the data recorded in step 6, regarding the faults.

This approach tests several boards simultaneously, rather than in sequence, thus saving time. Further, the central processor (or group of processors) is uninvolved in the testing procedure, except to initiate the test and read the results. Still further, as discussed above, the testing program can reside in the RAM being tested.

Detailed Explanation

Figure 5:
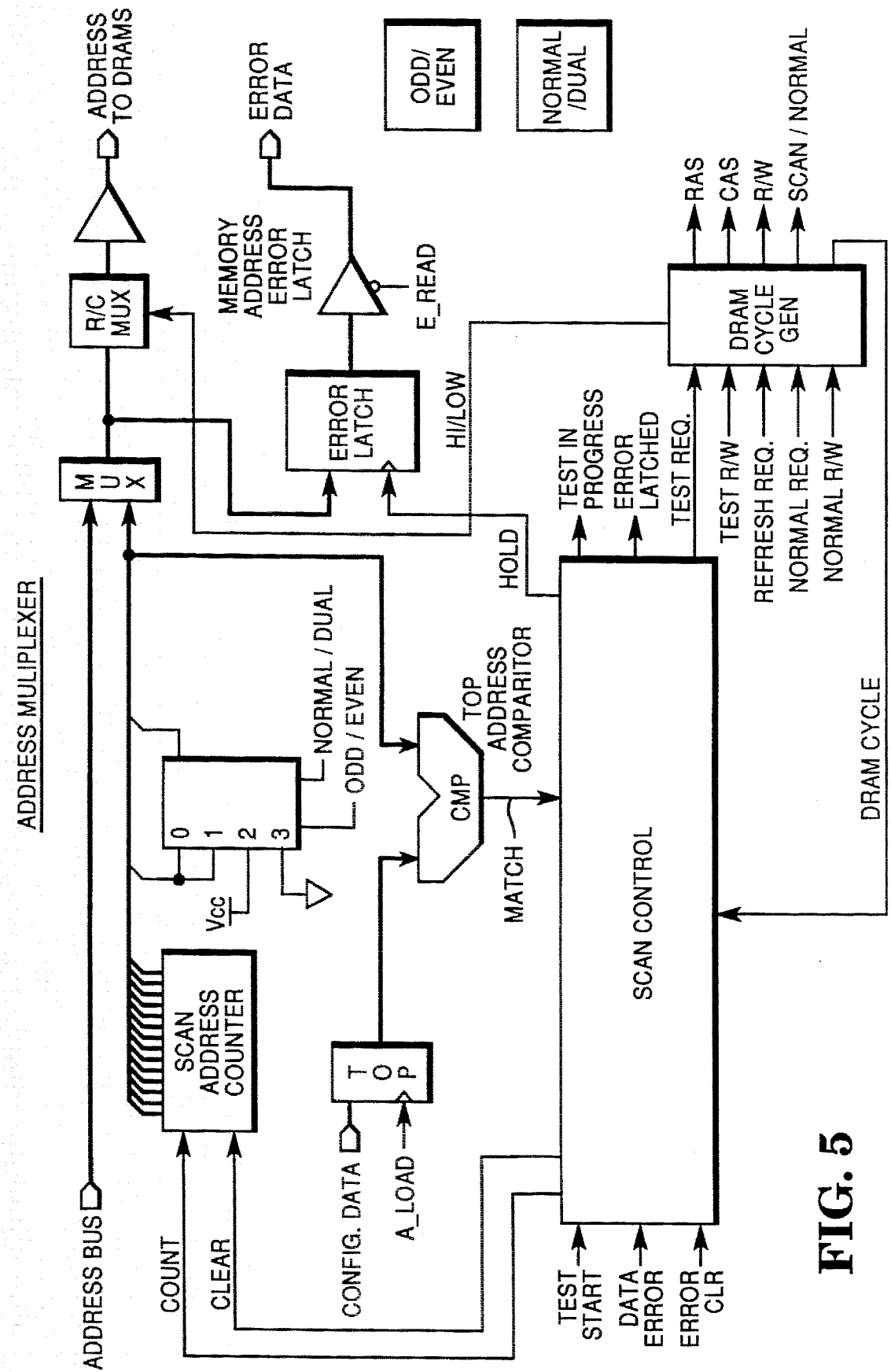
FIGS. 5 and 6 are schematics which show the components making up the equipment in dashed block 3.
Figure 6:
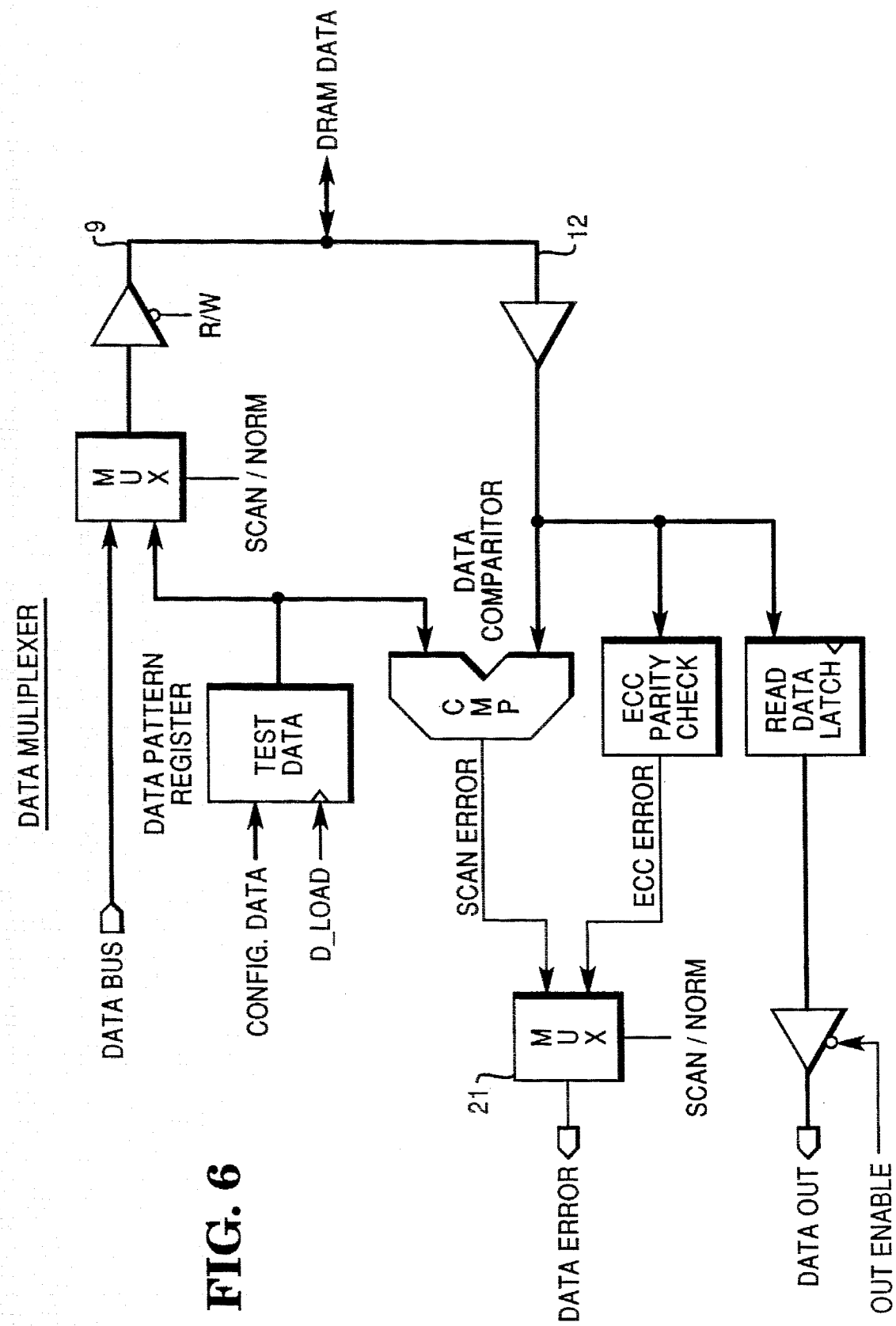

FIGS. 5 and 6

FIGS. 5 and 6 illustrate the testing apparatus in more detail. The components of these Figures will be explained in two stages, namely, an overview and a detailed discussion.

Overview

A SCAN CONTROL circuit in FIG. 5 orders a SCAN ADDRESS COUNTER into action. The SCAN ADDRESS COUNTER delivers a sequence of addresses to the ADDRESS MULTIPLEXER (which corresponds to MUX2 in FIG. 3), which passes the sequence to bus 6 in FIG. 5. Meanwhile, each address is compared, in a TOP ADDRESS COMPARATOR, with a ceiling address contained in register TOP. When the two addresses are equal, the ceiling address in the board has been reached and the address incrementation stops.

After the address has settled on bus 6, a DATA MULTIPLEXER in FIG. 6 (which corresponds to MUX1 in FIG. 3) takes a data pattern, or data word, from the DATA PATTERN REGISTER and delivers the pattern to bus 9. The data pattern is then written to the address on bus 6, under command of signals generated by the DRAM CYCLE GENERATOR in FIG. 5, which are sent to the memory controller, which is shown in FIG. 2.

After all addresses in the board have been written with the data pattern, the addressing starts over again, but for reading. During each read operation, the DATA COMPARATOR in FIG. 6 compares the data at each address with the DATA PATTERN contained in the register TEST DATA. If there is a discrepancy, the DATA COMPARATOR issues a SCAN ERROR signal. In addition, another type of error check is done, namely, a check of the parity of the error correction code. This check is done by the block ECC PARITY CHECK. If there is a discrepancy, an ECC ERROR signal is produced. Multiplexer MUX 21 delivers the errors to the SCAN CONTROL circuit in FIG. 5.

In response to errors, the SCAN CONTROL circuit directs, by way of a HOLD signal, that the address contained in register ERROR LATCH be stored in an ERROR STORAGE REGISTER. This storage operation records the address of the present faulty memory location.

Detailed Discussion of Individual Components

SCAN ADDRESS COUNTER (FIG. 5).

A signal on line 15 actuates the COUNTER, causing it to reset to zero. Then, each COUNT signal increments the COUNTER by one.

TOP ADDRESS COMPARATOR (FIG. 5).

A register TOP contains a number which indicates the highest address in the board. This number is provided either by the processor, by DIP switches on the memory board, or by other suitable apparatus. The COMPARATOR compares the address produced by the SCAN ADDRESS COUNTER with the address in register TOP. When they become equal, a MATCH signal is produced, indicating that the address applied on bus 6 in FIG. 4 now equals the address in register TOP. Thus, at this time, all addresses on the board have been covered.

ADDRESS MULTIPLEXER (FIG. 5.

Also indicated as MUX2 in FIG. 3).

This MULTIPLEXER selects one of two available addresses, and sends it to the memory, via bus 6 in FIG. 4. The available addresses are (1) that on the ADDRESS BUS in FIGS. 1 and 4 (which is the system address bus) and (2) that provided by the SCAN ADDRESS COUNTER. During the memory test, the latter address is selected. During normal computer operation, the former is selected.

MEMORY ADDRESS ERROR LATCH (FIG. 5).

This latch is a register which holds the address currently being applied (on bus 6 in FIG. 3) to memory. If an error at the memory address is detected (as later described), the address contained in this LATCH is written to another register (not shown). The use of this latter storage register allows additional information about the error (such as the identity of the specific integrated circuit in which the error occurred) to be stored, in addition to the address of the faulty memory location.

DATA PATTERN REGISTER (FIG. 6).

This REGISTER contains the data pattern, or data word, to be used. This pattern is written to each memory location. The particular pattern used is loaded by a processor into the DATA PATTERN REGISTER. The pattern can, of course, be changed.

DATA COMPARATOR (FIG. 6).

This COMPARATOR compares the data previously written (on bus 9 in FIG. 3) to the memory address (on bus 6 in FIG. 3) with the original data pattern, which is held in the DATA PATTERN REGISTER. If there is a discrepancy, a SCAN ERROR signal is generated.

DATA MULTIPLEXER (FIG. 6, also indicated as MUX1 in FIG. 3).

This MULTIPLEXER selects one of two available data words, and sends it to the memory. The available words are (1) that on the DATA BUS and (2) that provided by the DATA PATTERN REGISTER. During the memory test, the latter data is selected. During normal computer operation, the former is selected.

NORMAL/DUAL and ODD/EVEN REGISTERS

The NORMAL/DUAL register holds bits which indicate whether normal testing of the prior art type is to be done, or whether that of the present invention is to be used. If the latter is the case, then the ODD/EVEN register is read, which indicates which Megs (odd or even) are to be tested at this time. These registers are read by the processor or controller performing the test. The processor can be a main system processor, or a controller of the type in block 3 in FIG. 2.

SCAN CONTROL (FIG. 5).

This performs the following operations.

One, it receives a TEST START signal from a processor and initiates the testing sequence, by issuing the proper signal to the SCAN ADDRESS COUNTER. Also, it switches MUX1 and MUX 2 into the states shown in FIG. 3A.

Two, it issues the proper sequence of enabling signals (RAS, CAS, R/W, etc) to its associated memory controller in FIG. 2 and to the DRAM CYCLE GENERATOR (FIG. 5). These signals direct the memory controller to accept the address on bus 6 in FIG. 3A, to write the DATA PATTERN (on bus 9) to that address, and to read the data written. Three, it captures the DATA ERROR signals, produced by MUX 21 in FIG. 6, and, in response, orders the ERROR LATCH in FIG. 5 to store the address.

Designing an apparatus to perform these functions is known to those skilled in the art.

Therefore, once the processor (or other controller) issues a TEST START signal, as indicated in FIG. 5, the SCAN CONTROL circuit handles the rest of the testing. Accordingly, the processor is thereafter uninvolved in the testing procedure.

Numerous substitutions and modifications can be undertaken without departing from the true spirit and scope of the invention. For example, it was presumed that the TEST START signals issued to the blocks 3 in FIG. 2 were issued in sequence. Thus, each TESTING CIRCUIT in FIG. 4 begins at a different time and, in general, will run independently and asynchronously of each other. However, it is possible to trigger all the the blocks 3 simultaneously.

What is desired to be secured by Letters Patent is the Invention as defined in the following claims.

We claim:

1. In a computer having a processor and a memory device, with the processor being able to run a program which tests the operability of the memory device, a method comprising the steps of:

a) storing the program in a first part of the memory device;

b) running the program, after step (a), so as to test the operability of a second part of the memory device;

c) moving the program, after step (b), from the first part of the memory device to the second part of the memory device; and d) running the program, after step (c), so as to test the first part of the memory device.

2. A method of operating a program to test the operability of a memory device in a computer, comprising the steps of:

a) operating the program to test a first part of the memory device while the program is located in a second part of the memory device;

b) relocating the program, after step (a), from the second part of the memory device to the first part of the memory; and c) operating the program, after step (b), to test the second part of the memory device while the program is located in the first part of the memory device.

3. A procedure for operating a program to test the operability of a memory device in a computer, comprising the steps of:

a) running the program so as to test a first part of the memory device while the program is stored in a second part of the memory device;

b) copying the program, after step (a), from the second part of the memory device into the first part of the memory device; and c) running the program, after step (b), so as to test the second part of the memory device while the program is stored in the first part of the memory device.

4. A method of operating a program in order to test the operability of a random access memory (RAM) in a computer, comprising the steps of:

a) running the program to test a first part of the RAM while the program resides in a second part of the RAM;

b) relocating the program, after step (a), from the second part of the RAM to the first part of the RAM; and c) running the program, after step (b), to test the second part of the RAM while the program resides in the first part of the RAM.

* * * * *